United States Patent
Robertson et al.

(10) Patent No.: US 6,864,573 B2
(45) Date of Patent: Mar. 8, 2005

(54) TWO PIECE HEAT SINK AND DEVICE PACKAGE

(75) Inventors: Michael F Robertson, Huntsville, AL (US); Gary L Brown, Madison, AL (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 0 days.

(21) Appl. No.: 10/430,555

(22) Filed: May 6, 2003

(65) Prior Publication Data

US 2004/0222517 A1 Nov. 11, 2004

(51) Int. Cl.[7] ............................................... H01L 23/34
(52) U.S. Cl. ...................... 257/718; 257/719; 257/722; 257/726; 257/727; 257/732; 361/730; 361/732; 361/759; 361/801; 361/802; 361/831
(58) Field of Search ................................ 257/718, 719, 257/722, 726, 727, 732; 361/730, 732, 759, 801, 802, 831

(56) References Cited

U.S. PATENT DOCUMENTS

| | | | |
|---|---|---|---|
| 5,068,764 A | | 11/1991 | Bland et al. |
| 5,600,540 A | | 2/1997 | Blomquist |
| 6,225,559 B1 | * | 5/2001 | Hubner et al. ............. 174/52.1 |
| 6,255,376 B1 | | 7/2001 | Shikata et al. |
| 6,459,576 B1 | | 10/2002 | Bhatia et al. |
| 6,517,660 B2 | | 2/2003 | Ausnit |
| 6,518,496 B1 | | 2/2003 | Ducros et al. |
| 6,518,659 B1 | | 2/2003 | Glenn |
| 6,519,148 B2 | | 2/2003 | Nakagawa et al. |
| 6,570,398 B2 | * | 5/2003 | Murphy et al. ............. 324/755 |
| 6,644,982 B1 | * | 11/2003 | Ondricek et al. ............. 439/73 |
| 2001/0030037 A1 | | 10/2001 | Hellbruck et al. |

FOREIGN PATENT DOCUMENTS

JP  05114675 A  *  5/1993  ........... H01L/23/32

* cited by examiner

Primary Examiner—Tom Thomas
Assistant Examiner—Matthew E. Warren
(74) Attorney, Agent, or Firm—Ralph E. Smith

(57) ABSTRACT

A two piece electronic component heat sink and device package comprising a first piece configured to retain electronic components, and a second piece having a hinge region configured to moveably connect the second piece to the first piece, and a snap lock region opposite the hinge region, the snap lock region configured to secure the second piece to the first piece. A two piece electronic component heat sink and device package for a circuit board comprising: a first piece having an index slot for retaining said circuit board, and a second piece having a hinge region configured to pivotably connect the second piece and the first piece, and a snap lock region configured to secure the second piece to the first piece.

18 Claims, 4 Drawing Sheets

TWO PIECE HEAT SINK AND DEVICE PACKAGE

FIELD OF THE INVENTION

This invention relates to a combination heat sink package for circuit boards and other electronic components. More particularly, this invention relates to a heat sink package for mounting electronic components in vehicle applications.

BACKGROUND OF THE INVENTION

Since the vacuum tube, heat has been the anathema of electronic components. Advances in components and design have addressed this to some extent. Modern circuits do more using less power. Many subcomponents of modern electronics are barely warm after hours of use. But modern integrated circuits pack so much into such a small area that heat sinks, particularly for the central processor chip are commonplace. Such heat sinks may be passive or active. For example, passive finned heat sinks are described in U.S. Pat. No. 6,518,660 B2 and U.S. Published Application No. US 2001/0030037 A1; active heat sinks that integrate fans or liquid cooling are described in U.S. Pat. Nos. 6,459,576 and 6,519,148, respectively.

All heat sinks, whether active or passive, use varying amounts of material having a high coefficient of thermal conduction. This material is typically a metal such as aluminum or an alloy of aluminum.

For a heat sink to operate effectively, it must be must in good thermal contact with the electronic component. Typically, this is accomplished using a screw, bolt, clip, spring, etc., singly or in combination. Ideally, the electronic component is removeably connected to the heat sink to facilitate replacement and repair as needed. A spring clip device is described in U.S. Pat. No. 5,600,540.

The increased power, reliability, and durability of modern vehicles results to a large extent from the integration of sophisticated computer monitoring and integration. In land based vehicles, such as cars, trucks, busses, etc., overall onboard computing power that integrates every aspect of vehicle operation requires the presence of multitude of processors, as well as related power units, sensors, connectors, etc.

Many vehicles are currently manufactured with electronic components assembled on a circuit board that slides into a heat sink assembly. Such configuration involves a blind assembly procedure and since visual inspection is impossible, must frequently be repaired by replacing both the circuit board and the heat sink assembly.

In many vehicles, the electronic components are located in the engine compartment where increased ambient temperature reduces the overall efficiency of the heat sink. In addition, vehicle electronics confront a severe environment where dirt and vibration levels constantly challenge the integrity of the processors as well as their connections to related devices. Further, economics demands that all these factors be addressed with a device package that is inexpensive to manufacture, assemble, and connect.

SUMMARY OF THE INVENTION

One object of the invention is a heat sink for vehicle applications where the electronic component(s) are removeably connected to the heat sink to facilitate replacement and repair as needed.

Another object of the invention is a heat sink for vehicle applications fabricated to operate efficiently in the engine compartment or other extreme environments in a vehicle.

Another object of the invention is a heat sink that opens to permit visual inspection of the electronic component(s).

Still other objects of the invention are satisfied by a two piece electronic component heat sink and device package comprising a first piece configured to retain electronic components, and a second piece having a hinge region configured to pivotably connect the second piece to the first piece, and a snap lock region configured to secure the second piece to the first piece.

These and other objects of the invention are satisfied by a two piece electronic component heat sink and device package for an electronic circuit board comprising: a first piece having an index slot for retaining said circuit board; and a second piece having a hinge region configured to pivotably connect the second piece and the first piece, and a snap lock region configured to secure the second piece to the first piece.

DETAILED DESCRIPTION

Figure 1:
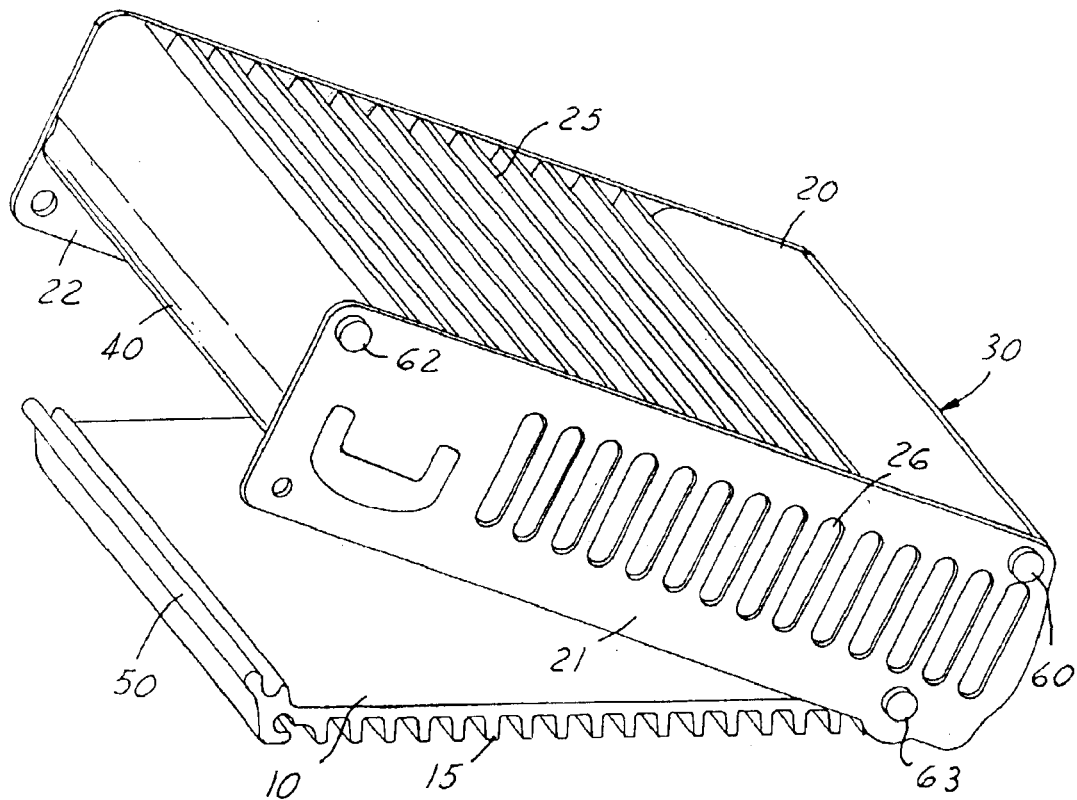
FIG. 1 is a perspective view of the heat sink and device package according to the invention in the open configuration.

A two piece electronic component heat sink and device package of the present invention comprises a first piece configured to retain electronic components to be packaged; and a second piece having a hinge region configured to moveably connect the second piece to the first piece, and a snap lock region configured to removeably secure the second piece to the first piece.

Electronic component as used herein refers to a circuit board, an integrated circuit, an encapsulated processing chip, etc. or combination thereof configured to operate in conjunction with each other to function as an amplifier, power supply, computer, etc.

The first piece is specifically configured to retain an electronic component or components. This can be accomplished, for example, via a molded in receptacle or the like corresponding in size and shape to the electronic component. This receptacle can be as simple as a groove or projecting pins, or as elaborate as a locking connector. Alternatively, the first piece may have a cutout to accommodate a standard non-locking or locking connector corresponding to a connector fitted on the electronic component. In alternative embodiments, the first piece may be configured with tabs and an index slot or only an index slot to retain a circuit board.

The heat sink and device package of the present invention can be of any size and shape to accommodate the desired electronic component. In some situations, enclosing a number of electronic components in the same heat sink will produce more heat than can be effectively dissipated, and should be avoided. In other situations, increased efficiency may be achieved by using a heat sink configured to accommodate electronic components (such as an amplifier or power supply) that are mounted on a single circuit board.

The present invention may be fabricated from any appropriate material having a high coefficient of thermal conduction. Such materials are aluminum and alloys of aluminum. Metal polymers or any other material having an effective coefficient of thermal conduction may also be used. The fabrication of the present invention may be accomplished using any appropriate technique such as casting, metal injection molding, reactive injection molding, etc.

Heat sinks are generally fabricated having fins in order to maximize the available surface area over which heat exchange can take place. Preferably, at least the first piece or the second piece in the device of the invention is finned. Most preferably, as much of the surface of the first piece and as much of the surface of the second piece are fabricated with fins to maximize heat exchange. In an alternative embodiment, the first piece and/or the second piece may be fabricated with active heat sinks that integrate fans or liquid cooling such as those described in U.S. Pat. Nos. 6,459,576 and 6,519,148, respectively.

In the invention, the second piece is pivotably connected to the first piece to create a structure that can be opened to permit insertion of an electronic component or components and closed to achieve maximum thermal contact between the heat sink and device package and electronic components and/or protectively encapsulate the electronic components.

In the Figures, like number are used to refer to like parts.

The first piece 10 is shown as the base of the assembly. The second piece 20 is shown as the top piece. Both the first piece 10 and the second piece 20 are shown configured with finned surfaces 15, 25 to increase the effective surface area of the pieces.

Figure 2:
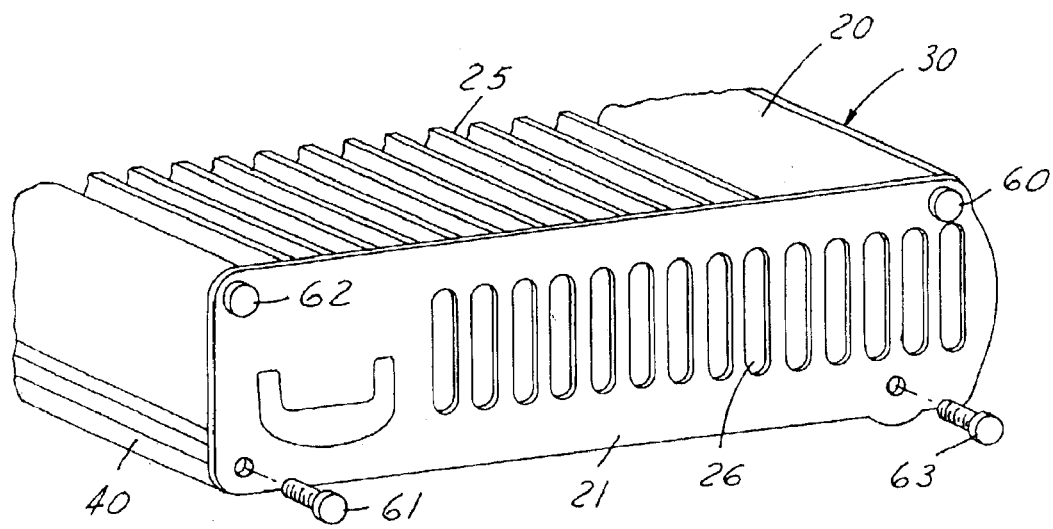
FIG. 2 is a perspective view of the heat sink and device package according to the invention in the closed configuration.

FIGS. 1 and 2, illustrate side vents 26 in a side piece 21 of the second piece 20. These side vents 26 may be present as illustrated, and/or on the face opposite the illustrated one, and/or on the illustrated face (not shown). Such side vents 26 increase air flow around the electronic component and may or may not be desirable depending on design parameters such as the specific electronic component(s) packaged in the assembly, the mounting location of the assembly, airflow on the assembly, etc. Depending on these parameters, the side vents 26 may be present, may be present but covered with screen or similar non-barrier material, or may not be present at all. All such configurations are specifically covered by the present invention.

The second piece 20 has a hinge region 30 at one edge configured to provide a pivotable connection to the first piece 10. This moveable connection my be a hinge or similar structure, and may extend along the entire edge of the second piece 20 or only at specific regions. The pivotable connection may be a separate hinge device formed from plastic or metal or an integrated hinge. Preferably this pivotable connection is integrally formed during the fabrication of the first piece 10 and the second piece 20 and does not require additional parts.

Figure 3:
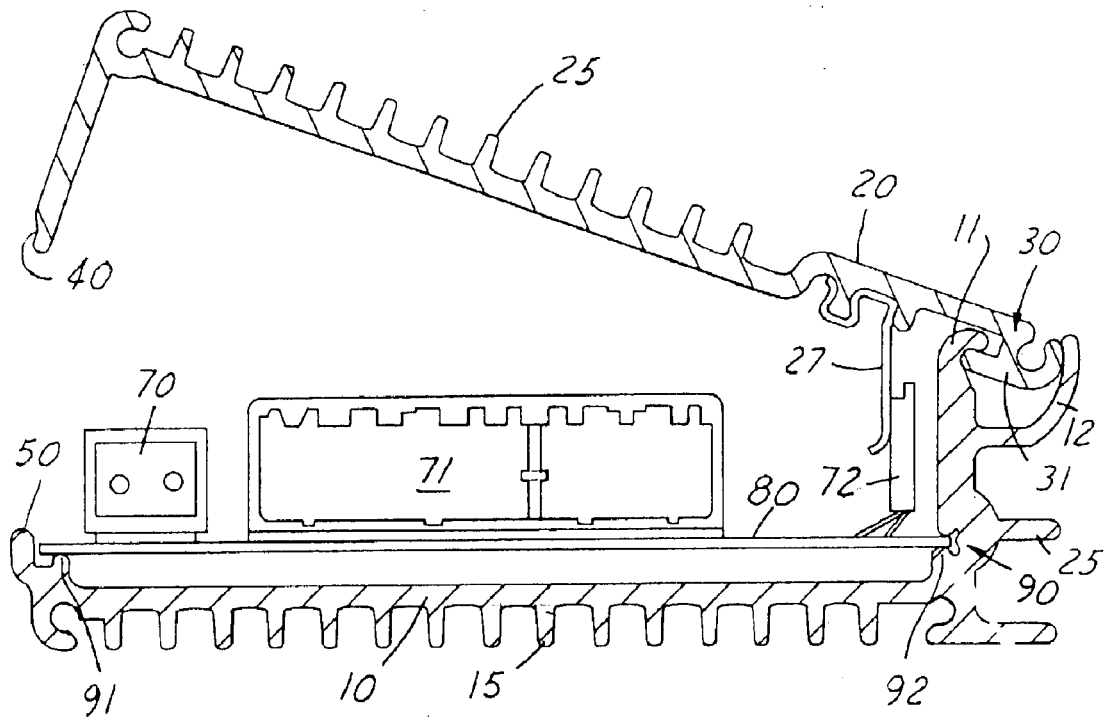
FIG. 3 is a sectional view of the heat sink and device package in the open configuration.
Figure 4:
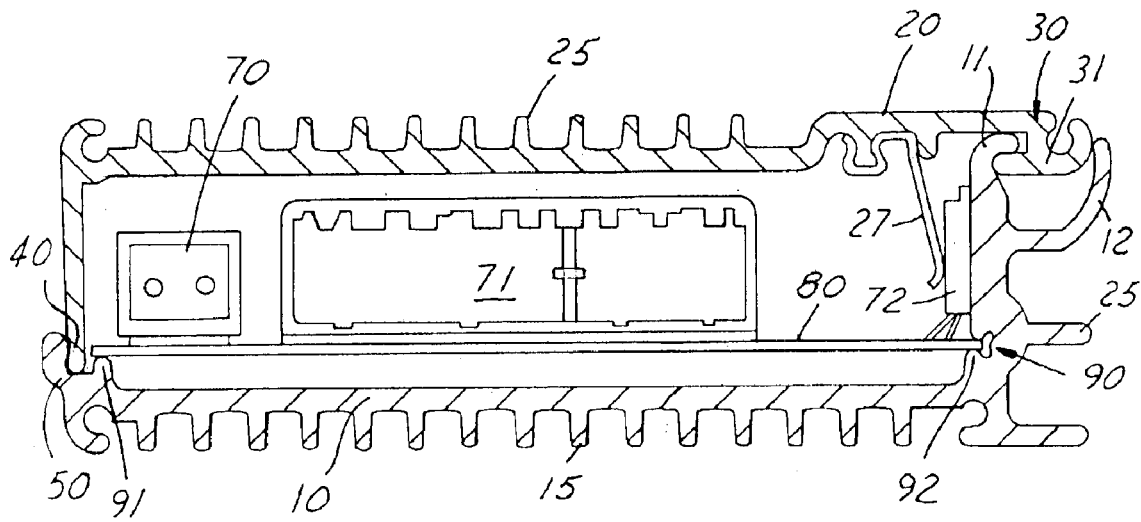
FIG. 4 is a sectional view of the heat sink and device package of the invention in the closed configuration.
Figure 5:
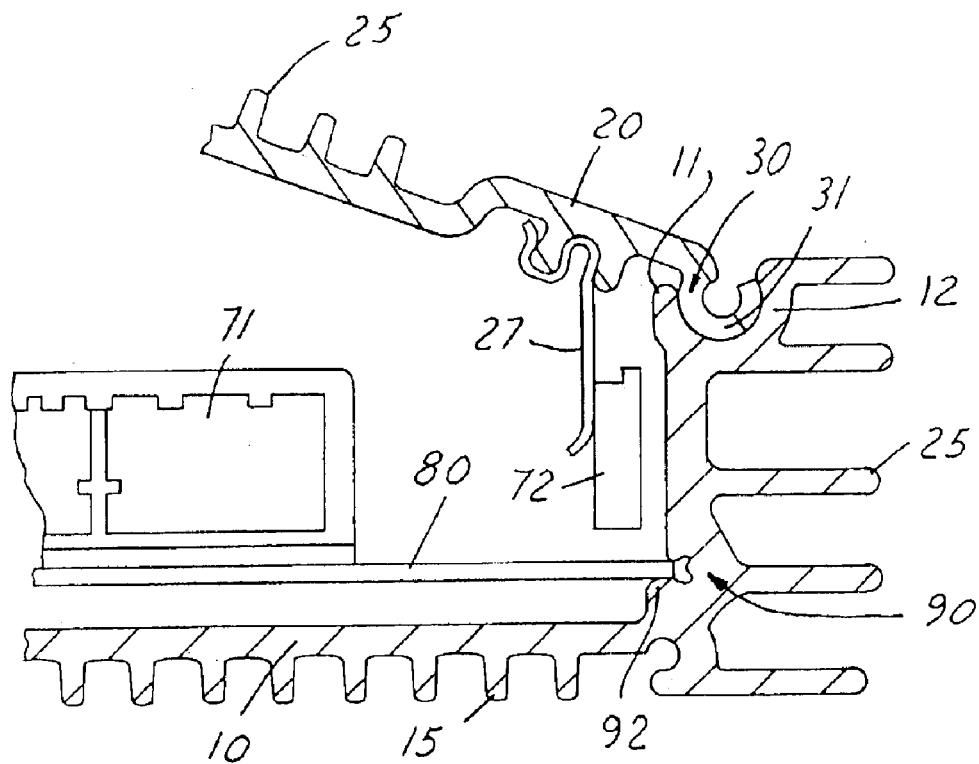
FIG. 5 is a sectional view of the hinge portion of the heat sink and device package of invention in the open configuration further illustrating details of a biasing clip, distinct integrated circuit packages, and the hinge assembly.
Figure 6:
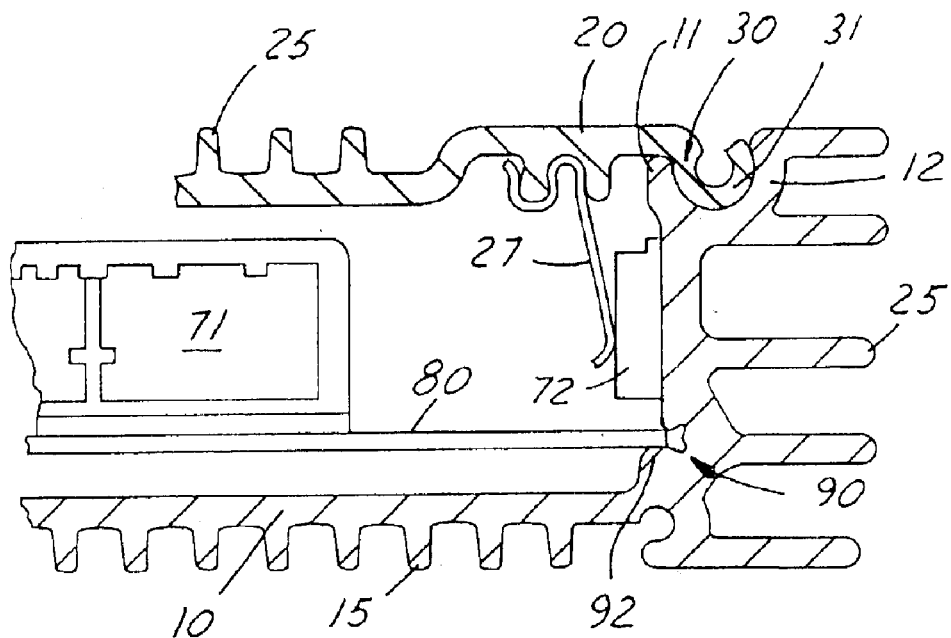
FIG. 6 is the sectional view of FIG. 5 in the closed configuration.

FIGS. 3, 4, 5, and 6, illustrate possible configurations for such an integral pivotable connection. All these Figures illustrate a portion of the first piece 10 formed to have projections 11 and 12 that create a region sized to partially enclose a projection 31 on the second piece 20. In FIGS. 3 and 4, the projection 31 is "T" shaped in cross-section and 11, 12, and 31 are configured such that a portion of 31 contacts portions of 11 and 12 to hold the second piece 20 in an open position as shown in FIG. 3. In FIGS. 5 and 6, the projection 31 is circular in cross-section as is the region formed by the projections 11 and 12 and friction between the contact areas of 11, 12, and 31 hold the second piece 20 in an open position as shown in FIG. 5. Friction between the contact areas can be increased by inserting a fastener, such as a screw 60 (as shown in FIGS. 1 and 2) to effectively expand the projection 31 relative to the projections 11 and 12.

In a preferred embodiment, the second piece also has a snap lock region 40 positioned opposite the hinge region 30. This snap lock region 40 incorporates a closure device.

Figure 7:
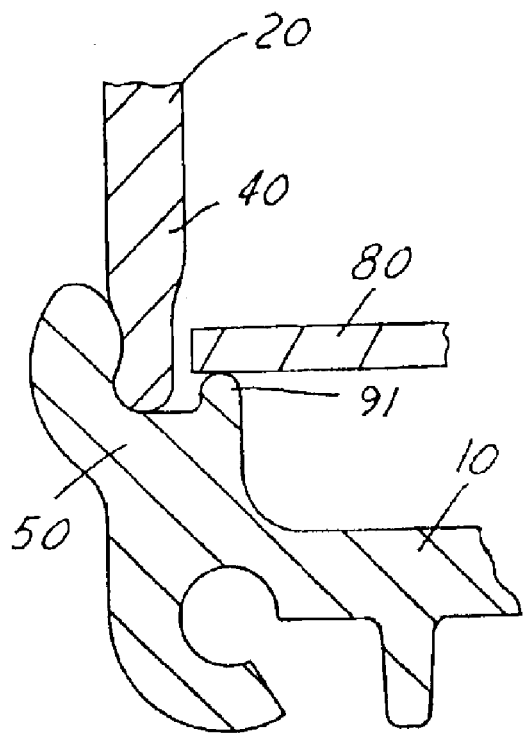
FIGS. 7 and 8 are sectional views of the fastening portion of the heat sink and device package illustrating alternative embodiments.
Figure 8:
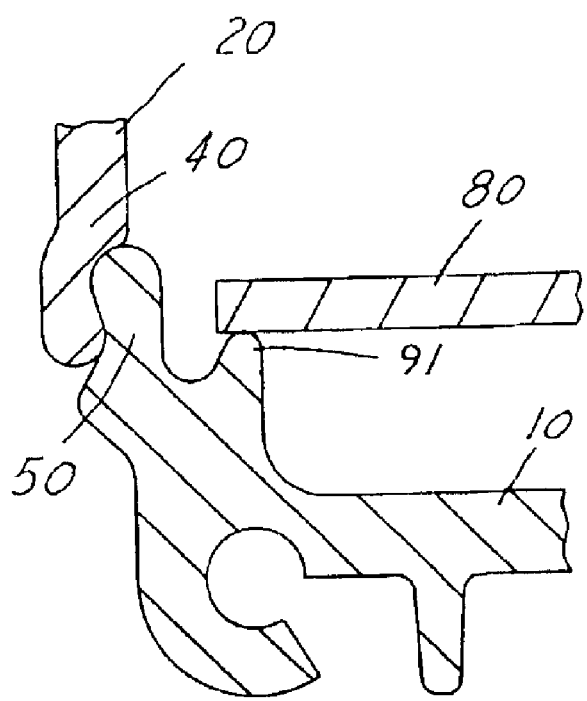

This closure device is preferably a snap lock tab that interacts with a corresponding region 50 on the first piece 10. Embodiments of the interaction between regions 40 and 50 are illustrated in FIGS. 7 and 8. In FIG. 7, the outer edge of region 40 is configured to interact with the inner edge of region 50. In FIG. 8, the inner edge of region 40 interacts with the outer edge of region 50 (where "inner" is used to refer to a surface facing toward the electrical component positioned in the heat sink device package and "outer" refers to a surface facing away from the electrical component). The snap lock region can, of course, also be positioned perpendicular to the hinge region.

Alternatively, rather than an integral snap lock, closure may be accomplished using additional components (such as a biasing means), or a fastener (such as a screw 61 or rivet), or an adhesive material. Additional sealing material, such as a flexible silicone sealant or a thermally conductive sealant (such as described in U.S. Pat. Nos. 6,255,376 B1 and 6,518,496 B1) may also be used with any closure device described herein as needed to provide an additional barrier to moisture, dust, etc. and/or increased conduction between the parts.

In a most preferred embodiment, as illustrated in FIGS. 3, 4, 5, and 6, the present invention is specifically figured to support a circuit board 80 containing a variety of electronic components 70, 71, 72. When piece 20 is pivoted in an open position along the hinge region 30 relative to piece 10, as shown in FIGS. 1, 3, and 5, the circuit board 80 can easily be positioned on support tabs 91 and 92. As the second piece 20 is moved toward the closed position as shown in FIGS. 2, 4, and 6, a spring clip 27 makes contact with the connector 72. As the second piece 20 is closed further, the pressure of the spring clip 27 on the connector 72 urges the circuit board 80 into the index notch 90 and seats the connector 72 in the connector integrated in the first piece (not shown). In this configuration, the spring clip 27, keeps the circuit board 80 in position and connected in the heat sink/device package of the invention.

The spring clip 27 may be a unitary body of resilient material such spring steel. As illustrated in FIGS. 3, 4, 5, and 6, in order to simplify assembly and reduce cost, the clip 27 may be configured to insert into a groove of the second piece 20. Not illustrated, but within the concept of the present invention is the inclusion of additional clips on the inside face (opposite the heat sink face 25) of second piece 20 positioned directly over the electrical components 70, 71. Such additional clips would be advantageous if the heat sink device package is intended for use in extreme vibration environments such as off road or military applications.

Alternately, the first piece 10 may be configured with an index notch 90 but without support tabs 91, 92 so that the circuit board 80 rests directly on the first piece 10. A thermally conductive compound, such as described in U.S.

Pat. Nos. 6,255,376 B1 and 6,518,496 B1 may be used to further enhance the heat transfer between the circuit board 80 and the first piece 10.

In general, an advantage of the present invention is that proper positioning of the electronic component(s) or circuit board(s) can be verified prior to final assembly, and the device can be opened at any time to visually inspect the component(s). If desired as an additional feature, the embodiment described above can be configured so that if the circuit board 80 and connector 72 are not properly positioned, the second piece 20 cannot be closed relative the first piece 10.

A single size assembly according to the present invention is adaptable to enclose a variety of electronic components on a single circuit board 80 (as shown), multiple circuit boards, or separate components mounted discretely. Such flexibility permits the same size heat sink device package to be used for a variety of applications thereby simplifying assembly methods and reducing cost.

In the heat sink device package of the present invention, the first piece 10 and the second piece 20 may each be fabricated from a single piece or multiple pieces. FIGS. 1 and 2 illustrate one possible fabrication configuration where the first piece 10 is a single "L" shaped piece and the second piece 20 is a "C" shaped piece having side pieces 21, 22. These side pieces may be attached as shown for side piece 21, using fasteners 60, 61, 62, 63 such as screws, brads, rivets, etc. If fastener's are used, they may also function to secure the second piece 20 to the first piece 10 in addition to or in lieu of the snap lock tab (fastener 61) or as part of the hinge assembly (fastener 60), as discussed above.

From the foregoing one skilled in the art will understand that the heat sink packaging assembly of the present invention can be fastened to a vehicle in a variety of locations as determined by design needs. Depending on the location in which the assembly must be fastened, it might be most advantageous to attach the first piece 10 or the second piece 20 directly to the vehicle, or use an appropriate bracket or hanger. All such mounting methods and configurations are within the scope of the present invention.

It is to be understood that although the invention has been described with particular reference to specific embodiments thereof, the forms of the invention shown and described are to be taken as a non-limiting embodiment and various changes and modifications may be made to the invention without departing from it's spirit and scope as defined in by the claims.

What is claimed is:

1. A two piece electronic component heat sink and device package comprising:
    a first piece configured to retain electronic components and having projections for creating a region, and
    a second piece having
        a hinge region with a T-shaped projection, where said region of said first piece entraps said T-shaped projection of said second piece and thereby pivotably connects said second piece and said first piece, and
        a snap lock region configured to secure said second piece to said first piece.

2. The two piece electronic component heat sink and device package described in claim 1, where said first piece is configured to retain and connect said electronic components.

3. The two piece electronic component heat sink and device package described in claim 1, where said first piece incorporates a connector configured to removeably connect and retain said electronic components.

4. The two piece electronic component heat sink and device package described in claim 1, where said second piece is biased relative to said first piece to permit said second piece to pivot at said hinge region and be moveably positioned relative to said first piece.

5. The two piece electronic component heat sink and device package described in claim 1, where said hinge region comprises an integral hinge.

6. The two piece electronic component heat sink and device package described in claim 1, where said snap lock region comprises an integral snap lock.

7. The two piece electronic component heat sink and device package described in claim 1, where said first piece and said second piece are configured to enclose and encapsulate said electronic components.

8. The two piece electronic component heat sink and device package described in claim 1, where said first piece and said second piece are fabricated with fins.

9. A two piece electronic component heat sink and device package for a circuit board comprising:
    a first piece having an index slot for retaining said circuit board and having projections for creating a region, and
    a second piece having
        a hinge region with a T-shaped projection, where said region entraps said T-shaped projection and thereby pivotably connects said second piece and said first piece, and
        a snap lock region configured to secure said second piece to said first piece.

10. The two piece electronic component heat sink and device package described in claim 9, where said first piece further comprises support tabs for said circuit board.

11. The two piece electronic component heat sink and device package described in claim 9, where said first piece incorporates a connector configured to removeably connect and retain said circuit board when said circuit board is properly positioned in said index slot.

12. The two piece electronic component heat sink and device package described in claim 9, where said second piece is biased against said first piece to permit said second piece to pivot at said hinge region and be moveably positioned relative to said first piece.

13. The two piece electronic component heat sink and device package described in claim 9, further comprising a spring clip attached to said second piece and positioned to urge said circuit board into said index slot as said second piece is pivoted at said hinge region to engage said first piece at said second region.

14. The two piece electronic component heat sink and device package described in claim 9, further comprising a spring clip attached to said second piece and positioned to urge said circuit board into said index slot and into a connector integrated into said first piece as said second piece is pivoted at said hinge region to engage said second piece with said first piece at said second region.

15. The two piece electronic component heat sink and device package described in claim 9, where said hinge region is an integral hinge.

16. The two piece electronic component heat sink and device package described in claim 9, where said snap lock region is an integral snap lock.

17. The two piece electronic component heat sink and device package described in claim 9, where said first piece and said second piece are configured to encapsulate said circuit board.

18. The two piece electronic component heat sink and device package described in claim 9, where said first piece and said second piece are finned.

* * * * *